(12) United States Patent
Harbers et al.

(10) Patent No.: US 9,261,245 B2
(45) Date of Patent: *Feb. 16, 2016

(54) LIGHT EMITTING DIODE MODULE WITH THREE PART COLOR MATCHING

(71) Applicant: Xicato, Inc., San Jose, CA (US)

(72) Inventors: Gerard Harbers, Sunnyvale, CA (US);
Peter K. Tseng, San Jose, CA (US);
Christopher R. Reed, Reno, NV (US)

(73) Assignee: Xicato, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/542,413

(22) Filed: Nov. 14, 2014

(65) Prior Publication Data

US 2015/0070888 A1 Mar. 12, 2015

Related U.S. Application Data

(60) Continuation of application No. 13/956,007, filed on Jul. 31, 2013, now Pat. No. 8,888,329, which is a continuation of application No. 13/744,274, filed on Jan. 17, 2013, now Pat. No. 8,500,297, which is a (Continued)

(51) Int. Cl.
*F21V 29/00* (2015.01)
*F21K 99/00* (2010.01)
(Continued)

(52) U.S. Cl.
CPC ... *F21K 9/56* (2013.01); *F21K 9/54* (2013.01); *F21V 9/10* (2013.01); *H01L 22/12* (2013.01);
(Continued)

(58) Field of Classification Search
USPC .......... 257/89, 79, 80, 81, E33.056, E33.072, 257/98; 362/231, 373, 800; 250/227.11; 438/27, 16, 26, 15
See application file for complete search history.

(56) References Cited

U.S. PATENT DOCUMENTS 3,593,055 A 7/1971 Geusic et al.
5,959,316 A 9/1999 Lowery
(Continued)

FOREIGN PATENT DOCUMENTS

EP 0 890 996 B1 1/1999
EP 1 548 851 A2 6/2005
(Continued)

OTHER PUBLICATIONS

International Search Report mailed on Feb. 23, 2010 for PCT Application No. PCT/US2009/064492 filed on Nov. 14, 2009, 16 pages.

(Continued)

*Primary Examiner* — Telly Green
(74) *Attorney, Agent, or Firm* — Silicon Valley Patent Group LLP (57) ABSTRACT

A light emitting diode module is produced using at least one LED and at least two selectable components that form a light mixing chamber. First and second selectable components have first and second types of wavelength converting materials with different wavelength converting characteristics. The first and second wavelength converting characteristics alter the spectral power distribution of the light produced by the LED to produce light with a color point that is a predetermined tolerance from a predetermined color point. Moreover, a set of LED modules may be produced such that each LED module has the same color point within a predetermined tolerance. The LED module may be produced by pre-measuring the wavelength converting characteristics of the different components selecting components with wavelength converting characteristics that convert the spectral power distribution of the LED to a color point that is a predetermined tolerance from a predetermined color point.

19 Claims, 6 Drawing Sheets

Related U.S. Application Data division of application No. 13/534,661, filed on Jun. 27, 2012, now Pat. No. 8,382,335, which is a division of application No. 12/617,668, filed on Nov. 12, 2009, now Pat. No. 8,220,971.

(60) Provisional application No. 61/117,060, filed on Nov. 21, 2008.

(51) Int. Cl.
| | | |
|---|---|---|
| *H01L 21/66* | (2006.01) | |
| *H01L 33/60* | (2010.01) | |
| *F21V 9/10* | (2006.01) | |
| *F21Y 101/02* | (2006.01) | |
| *F21Y 103/02* | (2006.01) | |

(52) U.S. Cl.
CPC .............. *H01L 33/60* (2013.01); *F21Y 2101/02* (2013.01); *F21Y 2103/022* (2013.01); *H01L 2924/0002* (2013.01); *Y10S 362/80* (2013.01)

(56) References Cited

U.S. PATENT DOCUMENTS

| | | | |
|---|---|---|---|
| 5,962,971 | A | 10/1999 | Chen |
| 5,966,393 | A | 10/1999 | Hide et al. |
| 5,982,092 | A | 11/1999 | Chen |
| 5,998,925 | A | 12/1999 | Shimizu et al. |
| 6,066,861 | A | 5/2000 | Hohn et al. |
| 6,068,383 | A | 5/2000 | Robertson et al. |
| 6,220,725 | B1 | 4/2001 | Arnold |
| 6,234,648 | B1 | 5/2001 | Borner et al. |
| 6,340,824 | B1 | 1/2002 | Komoto et al. |
| 6,351,069 | B1 | 2/2002 | Lowery et al. |
| 6,357,889 | B1 | 3/2002 | Duggal et al. |
| 6,469,322 | B1 | 10/2002 | Srivastava et al. |
| 6,504,301 | B1 | 1/2003 | Lowery |
| 6,576,930 | B2 | 6/2003 | Reeh et al. |
| 6,577,073 | B2 | 6/2003 | Shimizu et al. |
| 6,586,882 | B1 | 7/2003 | Harbers |
| 6,600,175 | B1 | 7/2003 | Baretz et al. |
| 6,621,211 | B1 | 9/2003 | Srivastava et al. |
| 6,649,946 | B2 | 11/2003 | Bogner et al. |
| 6,680,569 | B2 | 1/2004 | Mueller-Mach et al. |
| 6,724,142 | B2 | 4/2004 | Ellens et al. |
| 6,765,237 | B1 | 7/2004 | Doxsee et al. |
| 6,791,259 | B1 | 9/2004 | Stokes et al. |
| 6,809,342 | B2 | 10/2004 | Harada |
| 6,812,500 | B2 | 11/2004 | Reeh et al. |
| 6,850,002 | B2 | 2/2005 | Danielson et al. |
| 7,005,679 | B2 | 2/2006 | Tarsa et al. |
| 7,083,302 | B2 | 8/2006 | Chen et al. |
| 7,126,162 | B2 | 10/2006 | Reeh et al. |
| 7,250,715 | B2 | 7/2007 | Mueller et al. |
| 7,331,697 | B1 | 2/2008 | Hulse |
| 7,344,952 | B2 | 3/2008 | Chandra |
| 7,404,652 | B2 | 7/2008 | Ng et al. |
| 7,479,662 | B2 | 1/2009 | Soules et al. |
| 7,494,246 | B2 | 2/2009 | Harbers |
| 7,534,002 | B2 | 5/2009 | Yamaguchi et al. |
| 7,564,180 | B2 | 7/2009 | Brandes |
| 7,614,759 | B2 | 11/2009 | Negley |
| 7,629,621 | B2 | 12/2009 | Reeh et al. |
| 7,682,850 | B2 | 3/2010 | Harbers et al. |
| 7,768,192 | B2 | 8/2010 | Van De Ven et al. |
| 7,942,556 | B2 | 5/2011 | Harbers et al. |
| 7,984,999 | B2 | 7/2011 | Harbers et al. |
| 8,035,287 | B2 | 10/2011 | Schmidt et al. |
| 8,220,971 | B2 | 7/2012 | Harbers et al. |
| 8,382,335 | B2 | 2/2013 | Harbers et al. |
| 8,500,297 | B2 | 8/2013 | Harbers et al. |
| 8,746,922 | B2 | 6/2014 | Harbers et al. |
| 8,888,329 | B2 | 11/2014 | Harbers et al. |
| 2002/0043926 | A1 | 4/2002 | Takahashi et al. |
| 2005/0057145 | A1 | 3/2005 | Shieh et al. |
| 2006/0076882 | A1 | 4/2006 | Chan et al. |
| 2006/0087487 | A1 | 4/2006 | Ota |
| 2006/0125923 | A1 | 6/2006 | Israel et al. |
| 2006/0152140 | A1 | 7/2006 | Brandes |
| 2007/0081336 | A1 | 4/2007 | Bierhuizen et al. |
| 2007/0115665 | A1 | 5/2007 | Mueller et al. |
| 2007/0147032 | A1 | 6/2007 | Furukawa et al. |
| 2007/0215890 | A1 | 9/2007 | Harbers et al. |
| 2007/0223219 | A1 | 9/2007 | Medendorp, Jr. et al. |
| 2007/0263393 | A1 | 11/2007 | Van De Ven |
| 2008/0128735 | A1 | 6/2008 | Yoo et al. |
| 2008/0142816 | A1 | 6/2008 | Bierhuizen et al. |
| 2008/0169480 | A1 | 7/2008 | Weng et al. |
| 2008/0211751 | A1 | 9/2008 | Kim |
| 2008/0310152 | A1 | 12/2008 | Verbrugh et al. |
| 2008/0310158 | A1 | 12/2008 | Harbers et al. |
| 2009/0008655 | A1 | 1/2009 | Peeters et al. |
| 2009/0086475 | A1 | 4/2009 | Caruso et al. |
| 2009/0103293 | A1 | 4/2009 | Harbers et al. |
| 2010/0067214 | A1 | 3/2010 | Hoelen et al. |
| 2010/0127282 | A1 | 5/2010 | Harbers et al. |
| 2010/0327306 | A1 | 12/2010 | Van Der Burgt et al. |
| 2011/0026257 | A1 | 2/2011 | Holten et al. |
| 2012/0051045 | A1 | 3/2012 | Harbers et al. |
| 2012/0224177 | A1 | 9/2012 | Harbers et al. |
| 2012/0267653 | A1 | 10/2012 | Harbers et al. |

FOREIGN PATENT DOCUMENTS

| | | | |
|---|---|---|---|
| EP | 1 780 592 | A1 | 5/2007 |
| EP | 2 117 055 | A2 | 11/2009 |
| EP | 1 081 771 | B1 | 6/2011 |
| JP | 2005-093896 | A | 4/2005 |
| JP | 2006-032726 | A | 2/2006 |
| JP | 2008-159707 | A | 7/2008 |
| TW | I283078 | B | 6/2007 |
| TW | I296448 | B | 5/2008 |
| WO | WO 2007/002234 | A1 | 1/2007 |
| WO | WO 2007/130536 | A2 | 11/2007 |
| WO | WO 2008/047290 | A1 | 4/2008 |
| WO | WO 2008/126038 | A1 | 10/2008 |
| WO | WO 2008/142638 | A1 | 11/2008 |
| WO | WO 2008/149250 | A1 | 12/2008 |
| WO | WO 2008/157080 | A2 | 12/2008 |
| WO | WO 2008/157080 | A3 | 12/2008 |
| WO | WO 2009/052099 | A1 | 4/2009 |
| WO | WO 2009/052099 | A4 | 4/2009 |
| WO | WO 2009/093163 | A2 | 7/2009 |

OTHER PUBLICATIONS

International Preliminary Report on Patentability mailed on May 24, 2011 for PCT Application No. PCT/US2009/064492 filed on Nov. 14, 2009, 9 pages.

International Search Report mailed on Dec. 15, 2011 for PCT Application No. PCT/US2011/049017 filed on Aug. 24, 2011 by Xicato, Inc., 11 pages.

English Abstract of JP2008159707 (A) published on Jul. 10, 2008 visited at <http://worldwide.espacenet.com> on Sep. 18, 2012, 2 pages.

English Abstract of JP2005093896 (A) published on Apr. 7, 2005 visited at <http://worldwide.espacenet.com> on Sep. 18, 2012, 2 pages.

English Abstract of TWI296448 (B) published on May 1, 2008 visited at <http://worldwide.espacenet.com> on Sep. 18, 2012, 2 pages.

English Abstract of TWI283078 (B) published on Jun. 21, 2007 visited at <http://worldwide.espacenet.com> on Sep. 18, 2012, 2 pages.

(56) References Cited

OTHER PUBLICATIONS

Harbers et al. (Jun. 2007). "Performance of High Power Light Emitting Diodes in Display Illumination Applications," *Journal of Display Technology* vol. 3, No. 2, pp. 98-109.

Hoelen et al. (Sep. 12, 2008). "Remote Phosphor LED Modules for General Illumination Towards 200 lm/W General Lighting LED Light Sources," *SPIE* vol. 7058, pp. 1-10.

Notice of Allowance mailed on Sep. 6, 2013 for U.S. Appl. No. 13/956,007, filed Jul. 31, 2013 by Xicato, Inc., 10 pages.

Request for Continued Examination mailed on Dec. 6, 2013 for U.S. Appl. No. 13/956,007, filed Jul. 31, 2013 by Xicato, Inc., 12 pages.

Office Action mailed on Feb. 4, 2014 for U.S. Appl. No. 13/956,007, filed Jul. 31, 2013 by Xicato, Inc., 12 pages.

Response to Office Action mailed on Apr. 29, 2014 for U.S. Appl. No. 13/956,007, filed Jul. 31, 2013 by Xicato, Inc., 12 pages.

Notice of Allowance by mailed on Jun. 6, 2014 for U.S. Appl. No. 13/956,007, filed Jul. 31, 2013 by Xicato, Inc., 11 pages.

Machine translation in English of Abstract of JP 2006-032726-A visited at www.espacenet.com on Sep. 16, 2015, 2 pages.

LIGHT EMITTING DIODE MODULE WITH THREE PART COLOR MATCHING

CROSS REFERENCE TO RELATED APPLICATIONS

This application is a continuation of U.S. application Ser. No. 13/956,007, filed Jul. 31, 2013, which, in turn, is a continuation of U.S. application Ser. No. 13/744,274, filed Jan. 17, 2013, now U.S. Pat. No. 8,500,297, issued Aug. 6, 2013, which, in turn, is a divisional of U.S. application Ser. No. 13/534,661, filed Jun. 27, 2012, now U.S. Pat. No. 8,382,335, issued Feb. 26, 2013, which, in turn, is a divisional of U.S. application Ser. No. 12/617,668, filed Nov. 12, 2009, now U.S. Pat. No. 8,220,971, issued Jul. 17, 2012, which, in turn, claims the benefit of U.S. Provisional Application No. 61/117,060, filed Nov. 21, 2008, all of which are incorporated by reference herein in their entireties.

FIELD OF THE INVENTION

This invention relates to the field of general illumination, and more specifically, to illumination devices using semiconductor based lighting elements such as light emitting diodes (LEDs).

BACKGROUND

The use of light emitting diodes in general lighting is still limited due to limitations in light output level or flux generated by the illumination devices. Limits in flux are due to the limited maximum temperature of the LED chip, and the life time requirements, which are strongly related to the temperature of the LED chip. The temperature of the LED chip is determined by the cooling capacity in the system, and the power efficiency of the device (optical power produced by the LEDs and LED system, versus the electrical power going in). Illumination devices that use LEDs also typically suffer from poor color quality characterized by color point instability. The color point instability varies over time as well as from part to part. Poor color quality is also characterized by poor color rendering, which is due to the spectrum produced by the LED light sources having bands with no or little power. Further, illumination devices that use LEDs typically have spatial and/or angular variations in the color. Additionally, illumination devices that use LEDs are expensive due to, among other things, the necessity of required color control electronics and/or sensors to maintain the color point of the light source or using only a small selection of produced LEDs that meet the color and/or flux requirements for the application.

Consequently, improvements to illumination device that uses light emitting diodes as the light source are desired.

SUMMARY

A light emitting diode module is produced using at least one light emitting diode (LED) and at least two selectable components that are a part of a light mixing chamber that surrounds the LEDs and includes an output port. A first selectable component has a first type of wavelength converting material with a first wavelength converting characteristic and a second selectable component has a second type of wavelength converting material with a different wavelength converting characteristic. The first and second wavelength converting characteristics alter the spectral power distribution of the light produced by the LED to produce light through the output port that has a color point that is a predetermined tolerance from a predetermined color point. Moreover, a set of LED modules may be produced such that each LED module has the same color point within a predetermined tolerance. The LED module may be produced by pre-measuring the wavelength converting characteristics of the different components selecting components with wavelength converting characteristics that convert the spectral power distribution of the LED to a color point that is a predetermined tolerance from a predetermined color point.

DETAILED DESCRIPTION

Figure 1:
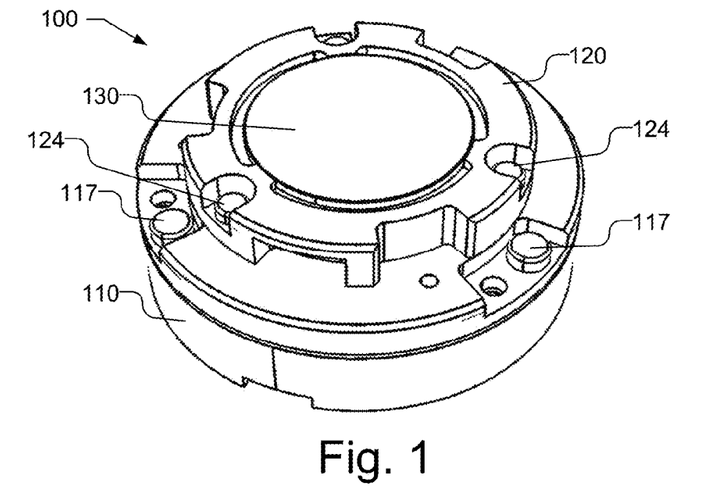
FIG. 1 illustrates a perspective view of an embodiment of a light emitting diode module.
Figure 2:
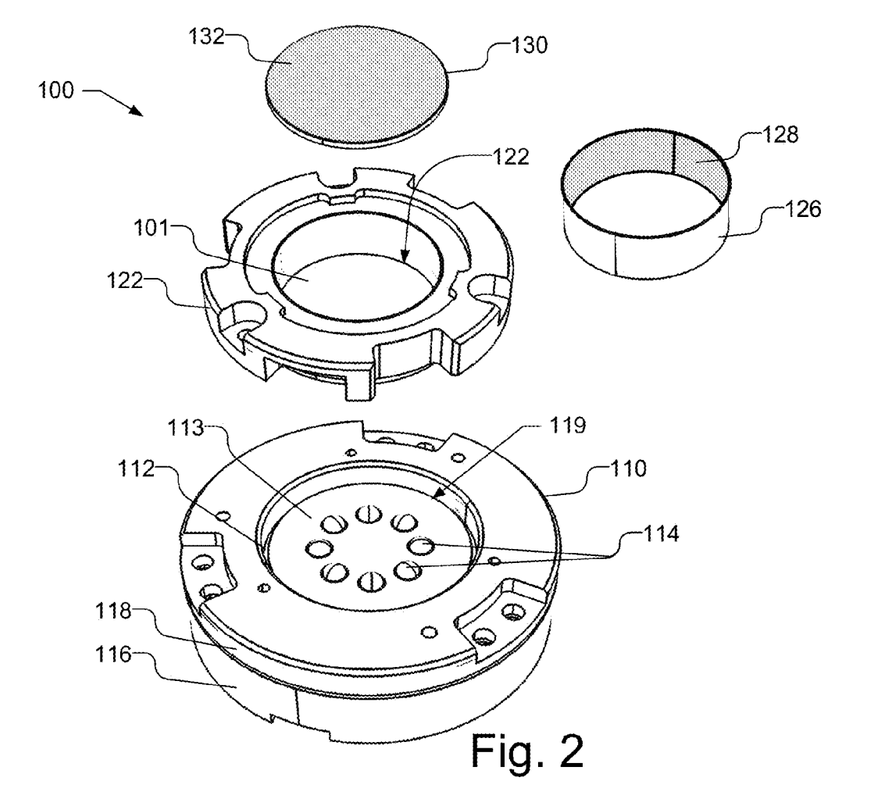
FIG. 2 illustrates a perspective, exploded view of the LED module from FIG. 1.

FIG. 1 illustrates a perspective view of an embodiment of a light emitting diode (LED) module 100 and FIG. 2 illustrates a perspective, exploded view of the LED module 100. It should be understood that as defined herein an LED module is not an LED, but is an LED light source or fixture or component part of an LED light source or fixture and contains an LED board, which includes one or more LED die or packaged LEDs. The LED module 100 is similar to the LED illumination device described in U.S. Ser. No. 12/249,874, entitled "Illumination Device with Light Emitting Diodes", filed Oct. 10, 2008, by Gerard Harbers, which has the same assignee as the present application and the entirety of which is incorporated by reference herein.

The LED module 100 includes a base 110 and a top section 120, which may be manufactured from highly thermally conductive material, such as an aluminum based material. The base 110 includes a board 112 with a plurality of LEDs 114 that may be symmetrically arranged. In one embodiment, the LEDs 114 are packaged LEDs, such as the Luxeon Rebel manufactured by Philips Lumileds Lighting. Other types of packaged LEDs may also be used, such as those manufactured by OSRAM (Ostar package), Luminus Devices (USA), or Tridonic (Austria). As defined herein, a packaged LED is an assembly of one or more LED die that contains electrical connections, such as wire bond connections or stud bumps, and possibly includes an optical element and thermal, mechanical, and electrical interfaces. The LEDs 114 may include a lens over the LED die. Alternatively, LEDs without a lens may be used. The board 112 provides electrical and thermal contact with the LEDs 114. The board 112 is also in thermal contact with the base 110, which acts as a heat sink. The board may be an FR4 board, e.g., that is 0.5 mm thick, with relatively thick copper layers, e.g., 30 μm to 100 μm, that serve as thermal contact areas. Alternatively, the board 104 may be a metal core printed circuit board (PCB) or a ceramic submount with appropriate electrical connections. Other types of boards may be used, such as those made of alumina (aluminum oxide in ceramic form), or aluminum nitride (also in ceramic form). The board 112 may include a reflective top surface or a reflective plate 113 may be mounted over the top surface of the board 112. The reflective plate 113 may be made manufactured from a material with high thermal conductivity, such as an aluminum based material that is processed to make the material highly reflective and durable. By way of example, a material referred to as Miro®, type Miro 27 Silver, manufactured by Alanod, a German company, may be used.

If desired, the base 110 may be produced from multiple pieces. For example, the base 110 may include a lower section 116 through which electrical connection to the board 112 is made and an upper section 118 that is attached to the lower section 116, e.g., by screws 117 (shown in FIG. 1), bolts, or other appropriate attachment mechanism. The upper section 118 may include an aperture 119 into which the board 112 and LEDs 114 extends.

The top section 120 includes a center aperture 122 that extends through the top section 120. The top section 120 is attached to the base 110 by screws 124, bolts, or other appropriate attachment mechanism. For example, the top section 120 may be screwed onto the base 110 if desired. An output port is defined by the center aperture 122 and is covered with a window 130 that is mounted to the upper surface of the top section 120, e.g., by epoxy, silicone or other appropriate attachment mechanism. The window 130 may be transparent or translucent to scatter the light as it exits. The window 130 may be manufactured from an acrylic material that includes scattering particles, e.g., made from TiO2, ZnO, or BaSO4, or other materials that have low absorption over the full visible spectrum. In another embodiment, the window 130 may be a transparent or translucent plate with a microstructure on one or both sides. By way of example, the microstructure may be a lenslet array, or a holographic microstructure. Alternatively, the window 130 may be manufactured from $AlO_2$, either in crystalline form (Sapphire) or on ceramic form (Alumina), which is advantageous because of its hardness (scratch resistance), and high thermal conductivity. The thickness of the window may be between e.g., 0.5 and 1.5 mm. If desired, the window may have diffusing properties. Ground sapphire disks have good optical diffusing properties and do not require polishing. Alternatively, the diffuse window may be sand or bead blasted windows or plastic diffusers, which are made diffusing by dispersing scattering particles into the material during molding, or by surface texturing the molds.

A sidewall insert 126 may be positioned within the center aperture 122 of the top section 120 to define the sidewalls. Alternatively, the sidewalls may be defined by the walls of the aperture 122 itself. The sidewall insert 126 may be, e.g., manufactured from a material referred to as Miro®, type Miro 27 Silver, manufactured by Alanod, a German company. The sidewall insert 126 may be produced as a strip of material that is bent to form a ring shape. When assembled, a light mixing chamber 101 is defined by the sidewalls of the center aperture 122 of the top section 120, e.g., the sidewall insert 126, along with the window 130 and the reflective bottom surface, e.g., the reflective plate 113 on the board 112 of the base 110, which are, therefore, sometimes collectively referred to as components of the chamber 101.

Figure 3:
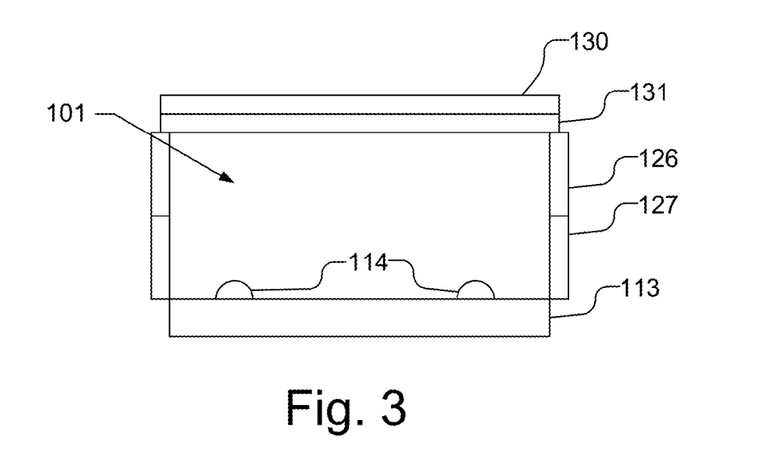
FIG. 3 illustrates a cross-sectional view of an embodiment of the light mixing chamber of the LED module of FIG. 1 with multiple sidewall inserts and windows.

The light mixing chamber 101 of the LED module 100 may be formed from different or additional components. For example, as illustrated in cross-sectional view in FIG. 3, the light mixing chamber 101 of the LED module 100 is illustrated as being formed from the reflective plate 113, two sidewall inserts, a top sidewall insert 126 and a bottom sidewall insert 127, and two windows, a top window 130 and a bottom window 131.

At least two of the components of the chamber 101 are coated or impregnated with different wavelength converting materials, and are sometimes referred to herein as wavelength converting components. The different types of wavelength converting materials on the wavelength converting components have different wavelength converting characteristics. By way of example, the window 130 may be coated with a first type of wavelength converting materials 132 that, e.g., converts blue light to yellow light, while the sidewall insert 126 may be coated with second type of wavelength converting material 128 that, e.g., converts blue light to red light. In one embodiment, the sidewall insert 126 is not used and the sidewalls of the center aperture 122 are coated with a wavelength converting material. If desired, the reflective plate 113 may be coated with wavelength converting material that may be the same or differ from the other wavelength converting materials on other wavelength converting components. If desired, the top and bottom sidewall inserts 126, 127 and/or windows 130, 131 (FIG. 3) may be coated with different wavelength converting materials. Thus, a portion of the converted light from window 130 will be transmitted into the light mixing chamber 101 through the bottom window 131.

The wavelength converting materials may be phosphor or luminescent dyes, which will be generally referred to herein as phosphor for the sake of simplicity. By way of example, the phosphors used as the wavelength converting materials may be chosen from the set denoted by the following chemical formulas: $Y_3Al_5O_{12}$:Ce, (also known as YAG:Ce, or simply YAG), $Lu_3Al_5O_{12}$ (also known as LuAG:Ce, or simply LuAG), $(Y,Gd)_3Al_5O_{12}$:Ce, CaS:Eu, SrS:Eu, $SrGa_2S_4$:Eu, $Ca_3(Sc,Mg)_2Si_3O_{12}$:Ce, $Ca_3Sc_2Si_3O_{12}$:Ce, $Ca_3Sc_2O_4$:Ce, $Ba_3Si_6O_{12}N_2$:Eu, (Sr,Ca)AlSiN$_3$:Eu, CaAlSiN$_3$:Eu. The phosphor or combination of phosphors may be mixed as a dispersion in a binder for application to a surface by spray painting, screen printing, stenciling, or doctor blading techniques. These techniques are useful to deposit small dots of phosphor, stripes of phosphor, or to uniformly coat the surface. Alternatively, the phosphor or combination of phosphors may also be mixed in powder form with small pellets of binding material for application to a surface, e.g., by spraying or by application of an electric field, as part of a powder coating process. The small pellets have a low melting point and uniformly coat the surface when heated to the melting point of the binder.

With the two or more of wavelength converting components of the light mixing chamber 101 each with different wavelength converting properties, the LED module 100 may produce a predetermined or target color point with a high degree of accuracy.

Figure 4:
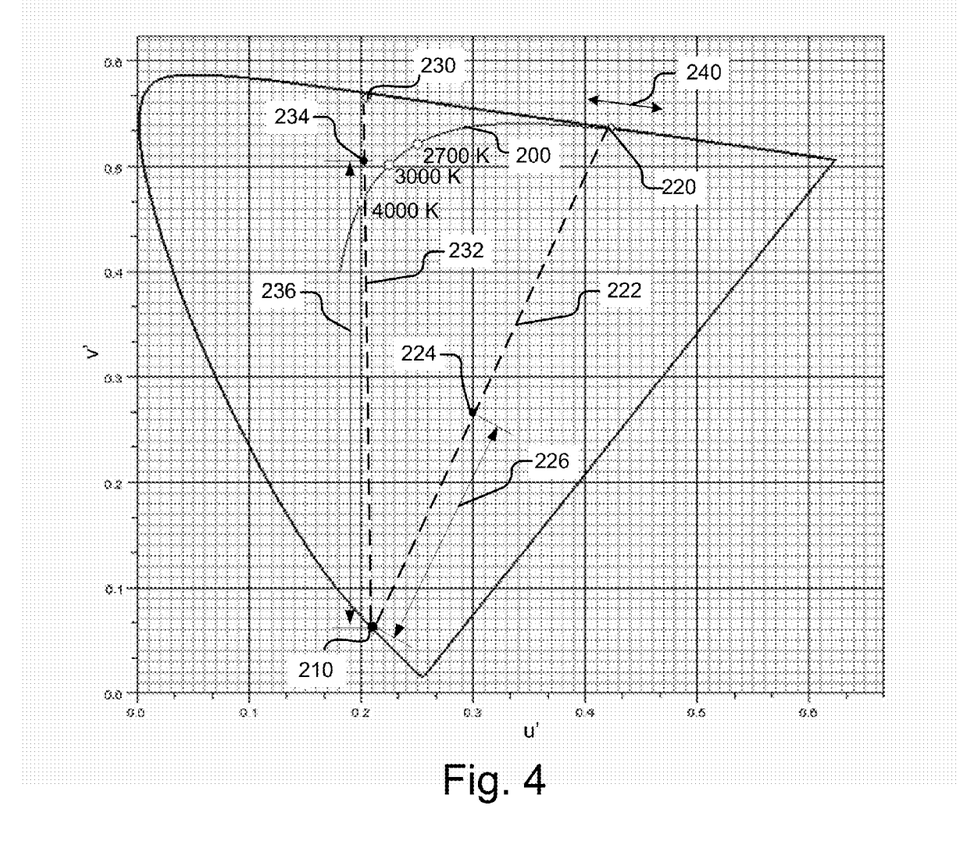
FIG. 4 shows a (u'v') chromaticity diagram, which is also known as the CIE 1976 UCS (uniform chromacity scale) diagram.
Figure 5:
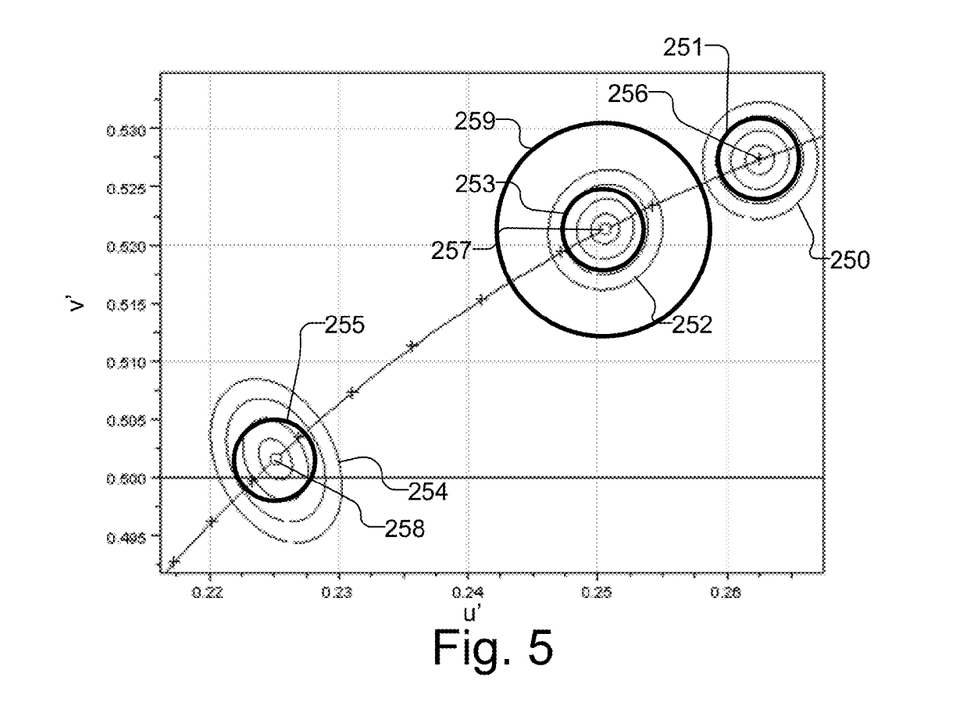
FIG. 5 illustrates example target color points and tolerance metrics on the CIE 1976 UCS diagram.

FIG. 4 shows a (u'v') chromacity diagram, which is also known as the CIE 1976 UCS (uniform chromacity scale) diagram. The CIE 1976 UCS diagram illustrates the chromacities of a black-body radiator by curve 200, which is sometimes referred to as the Planckian locus. Ideally, light sources produce light that lies on the black-body curve 200 at a target color point. In practice, however, producing light at a target color point on the black-body curve 200 is difficult, particularly with an LED light source because of the lack of precise control over the light output of an LED light source manufactured using current processes. Typically, there will be some distance between the color point of the light produced by the light source and the target color point on the black-body curve 200, which is known as the degree of departure from the target color point on the black-body curve. In the context of the CIE 1976 UCS diagram illustrated in FIG. 4, target color points 256-258 are illustrated as exemplary target color points and the degree of departure from the target color point is referred to in units of Δu'v'. When the color point of a light source varies significantly from a predetermined target color point, the color of the light will be perceptively different from the desired color. Moreover when light sources are near each other, e.g., in accent lighting or a display, even slight color differences are noticeable and considered undesirable. One measure of variation from a target color point is the MacAdam ellipse. The MacAdam ellipse generally refers to a region on a chromaticity diagram that contains all colors that are indistinguishable to the average human eye from the color at the center of the ellipse. The MacAdam ellipse is based on empirically based "just noticeable differences" between colors. Because the human eye is more sensitive to some colors than others, the size of the MacAdam ellipse may differ depending on its location in the chromaticity space. FIG. 5 illustrates 1, 2, 3, and 4 step MacAdam ellipses 250, 252, and 254 around target color points 256, 257, and 258, respectively, in a u'v' CIE 1976 UCS diagram. Another measure of variation from a target color point is a degree of departure Δu'v' from the target color point. For example, the target color point may be color point 256 on the black-body curve and all color points within circle 251 exhibit a degree of departure Δu'v' that is less than 0.0035. Similarly, circles 253 and 255 illustrate degrees of departure less than 0.0035 about target color points 257 and 258, respectively. As can be seen in FIG. 5, a degree of departure Δu'v' that is less than 0.0035 is approximately equivalent to a two-step MacAdam ellipse, illustrated by the lighter circles. Circle 259 illustrates a degree of departure Δu'v' that is less than 0.009 about color point 257. Thus, the specification for color of light output by LED module 100 can be expressed as a color within a predetermined tolerance of a target color point. For example, LED module 100 may achieve a particular target color point within a two-step MacAdam ellipse. In another example, LED module 100 may achieve a particular target color point within a degree of departure Δu'v' less than 0.009. Both larger and smaller predetermined tolerance levels may be achieved with LED module 100 if desired.

An LED is typically binned after a production run based on a variety of characteristics derived from their spectral power distribution. The cost of the LEDs is determined by the size (distribution) of the bin. For example, a particular LED may be binned based on the value of its peak wavelength. The peak wavelength of an LED is the wavelength where the magnitude of its spectral power distribution is maximal. Peak wavelength is a common metric to characterize the color aspect of the spectral power distribution of blue LEDs. Many other metrics are commonly used to bin LEDs based on their spectral power distribution (e.g. dominant wavelength, xy color point, uv color point, etc.). It is common for blue LEDs to be separated for sale into bins with a range of peak wavelength of five nanometers.

As discussed above, LED module 100 includes a board 112 with a plurality of LEDs LEDs 114. The plurality of LEDs 114 populating board 112 are operable to produce light with a particular spectral power distribution. The color aspect of this spectral power distribution may be characterized by its centroid wavelength. A centroid wavelength is the wavelength at which half of the area of the spectral power distribution is based on contributions from wavelengths less than the centroid wavelength and the other half of the area of the spectral power distribution is based on contributions from wavelengths greater than the centroid wavelength. In some production examples, the centroid wavelengths for a plurality of boards each having a number of LEDs, e.g., eight LEDs, will differ by 1 nm or more. Where the boards are populated with LEDs carefully selected for their close to matching spectral power distribution or with LEDs from a small bin, the centroid wavelengths will differ by 0.5 nm or more. Of course, costs increase significantly by producing boards with a closely matched centroid wavelengths.

The LED module 100 can accommodate LEDs with a wide spectral power distribution while still achieving a target color point within a predetermined tolerance. Moreover, multiple LED modules 100 may be produced, each with one or more LEDs having different spectral power distributions, e.g., a deviation in centroid wavelengths of 0.5 nm to 1.0 nm or more, while still achieving closely matched color points from one LED module 100 to the next and, where the matching color points of the LED modules 100. Moreover, the color points from the LED modules 100 may also be within a predetermined tolerance from a target color point. Thus, less expensive LEDs may be used. By using the two or more selectable wavelength converting components of the light mixing chamber 101, the color point of the light emitted by the LED module 100 may be accurately controlled. For example, during assembly of the LED module 100, the two or more wavelength converting components may be selected based on their wavelength converting characteristics and the spectral power distribution of the light produced by the LEDs 114 so that the resulting light that is transmitted through the window 130 has a color point that is within a predetermined tolerance of a predetermined target color point. The wavelength converting components of the LED module 100 may be selected to produce a desired degree of departure Δu'v' of between 0.009 and 0.0035 and smaller if desired, such as 0.002. For example, LED modules 100 having light sources with centroid wavelengths that differ by more than 1.0 nm may be produced using selected wavelength converting components to produce a degree of departure of Δu'v' of 0.007 or less, such as 0.0035. Where LED modules 100 have light sources with centroid wavelengths that differ by more than 0.5 nm, the wavelength converting components may be selected to produce a degree of departure of Δu'v' of 0.0035 or less.

The CIE 1960 UCS color space has generally been superseded by the CIE 1976 UCS as an expression of uniform chromaticity space. However, the CIE 1960 UCS color space is still useful as an expression of chromaticity because the isothermal lines of correlated color temperature (CCT) are lines aligned perpendicular to the Planckian locus. Producing a target color point is desirable for light sources in general. For example, when used for purposes of general illumination, it is desirable that the LED module 100 produce white light with a particular correlated color temperature (CCT). CCT relates to the temperature of a black-body radiator and temperatures between 2700K and 6000K are typically useful for general illumination purposes. Higher color temperatures are considered "cool" as they are bluish in color, while lower temperatures are considered "warm" as they contain more yellow-red colors. By way of example, CCTs of 2700K, 3000K, 3500K, 4000K, 4200K, 5000K, 6500K on the black body curve or a CCT in illuminant series D are often desirable. In the context of the CIE 1960 UCS diagram, the degree of departure is the distance between the color point of the light produced by the light source and the Planckian locus along a line of constant CCT. In the context of the CIE 1960 UCS diagram, the degree of departure is referred to in units of $\Delta$uv. Thus, the color point of a white light source may be described as a CCT value and a $\Delta$uv value, i.e., the degree of departure from the black-body curve as measured in the CIE 1960 color space. It follows that the specification for color of light output by LED module 100 can be expressed as a CCT value within a predetermined tolerance and a $\Delta$uv value within a predetermined tolerance.

Figure 6:
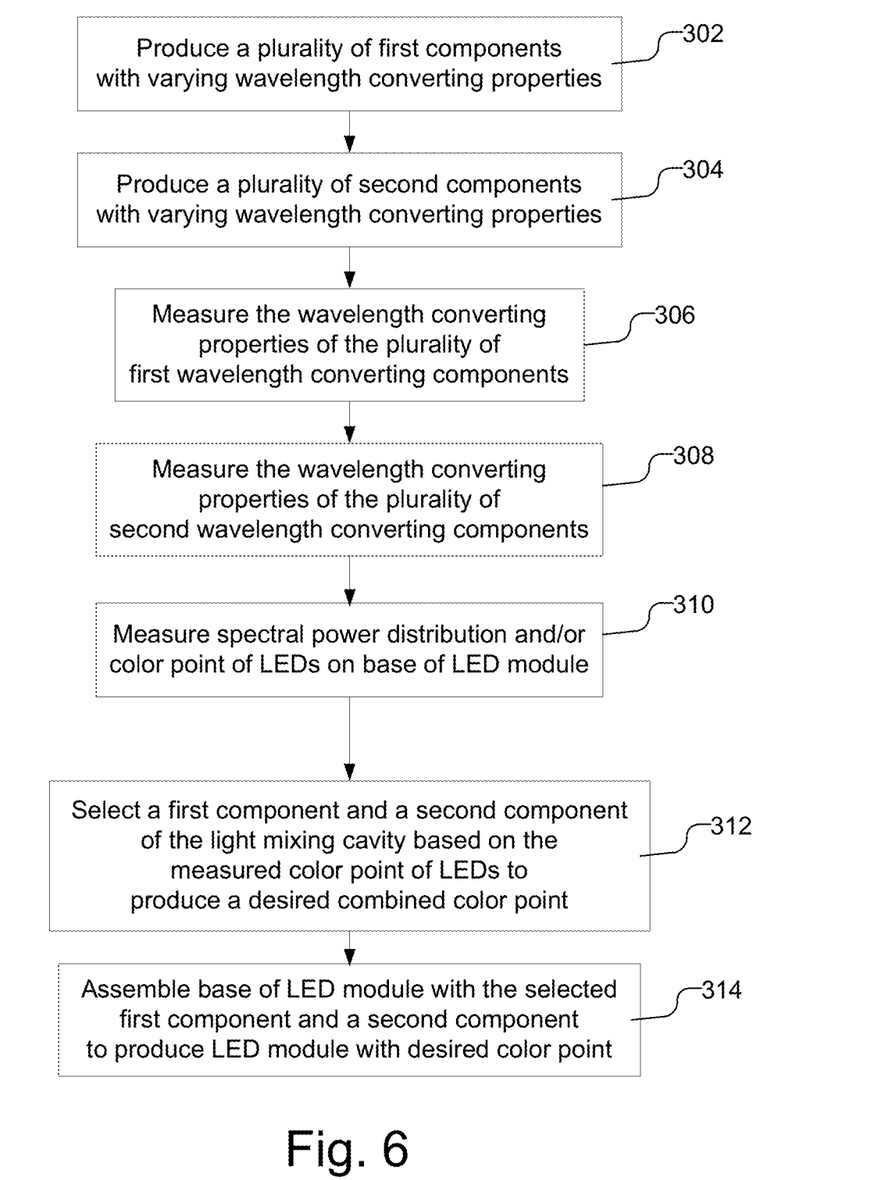
FIG. 6 is a flow chart illustrating the part of the assembly process for an LED module.

FIG. 6 is a flow chart illustrating a part of the assembly process for an LED module 100. As illustrated in FIG. 6, a plurality of each of the wavelength converting components are produced with varying wavelength converting properties (302 and 304). If desired, the wavelength converting components may be produced by the entity that assembles the LED module 100 or by an external entity that then provides the wavelength converting components to the entity that assembles the LED module 100. The different wavelength converting characteristics of the wavelength converting components are produced, e.g., by varying the concentration and/or the thickness of the wavelength converting material on or in the components. The concentration and/or the thickness of the wavelength converting material may be varied to produce components with wavelength converting characteristics that differ by 0.001 $\Delta$uv (in the CIE 1960 diagram) or less. For example, a plurality of windows 130 may be produced, with different concentrations and/or thicknesses of yellow wavelength converting material 132. Similarly, a plurality of sidewall inserts 126 (or reflective plate 113) may be produced, with different concentrations and/or thicknesses of red wavelength converting material 128. If desired, the same formulation of wavelength converting material may be used for each component, e.g., the sidewall inserts 126 or windows 130, but with differing concentrations and/or thicknesses. Additionally, different formulations of wavelength converting material may be used, e.g., different mixtures of various wavelength converting materials may be used. For example, the sidewall inserts 126 may be coated with a wavelength converting material 128 having differing ratios of red and yellow phosphors with the same or different concentrations and thicknesses. Similarly, different areas of the component may be coated with different wavelength converting materials. Further, the same concentration and thickness may be used, but with differing amounts of coverage area on the component, e.g., the amount of uncovered portion of the sidewall insert may vary.

The wavelength converting characteristics of the plurality of the wavelength converting components are measured (306 and 308). The wavelength converting components are placed on a test fixture, which includes a light source, e.g., a board 112 with LEDs 114, that produces light with a known spectral power distribution and color point. The wavelength converting components are separately placed on the test fixture and the color point shift is measured using, e.g., a spectrometer and an integrating sphere. If desired, an intensity measurement using a dichroic filter can be done as well as or instead of the integrating sphere measurement, or a colorimeter such as produced by Konica-Minolta (CL-200 colorimeter) can be used. The measured wavelength converting characteristics for each component is stored. A self referencing measurement may be used for the wavelength converting characteristics of the components. For example, color point produced by the full spectral power distribution of the LEDs 114 and the measured component may be compared to the color point produced by the spectral power distribution that excludes the wavelength converted light to produce a self referencing $\Delta$uv value.

The color point shift of the wavelength converting components is illustrated in the CIE 1976 diagram of FIG. 4. The color point of the test light source, which produces blue light at, e.g., 445 nm, is illustrated as point 210 in the diagram. The color point produced by, e.g., the wavelength converting material on or within the sidewall insert 126 is illustrated as point 220, which corresponds with a dominant wavelength of, e.g., 630 nm. The color point shift produced by the sidewall insert 126 with the test light source is along the dotted line 222, where the amount of the shift will depend on the geometry of the light mixing chamber 101 and the thickness and/or concentration of the wavelength converting material 128 on the sidewall insert 126. By way of example, the measured color point produced by one of the sidewall inserts 126 with the test light source is illustrated by point 224 and the shift $\Delta$u'v' from the color point produced by the test light source without the sidewall insert 126 (e.g., point 210) is illustrated by line 226.

The color point produced by, e.g., the wavelength converting material on or within the window 130, is illustrated as point 230 which corresponds with a dominant wavelength of, e.g., 570 nm. The color point shift produced by a window 130 with the test light source is along the dotted line 232 depending on the thickness and/or concentration of the wavelength converting material 132 on the window 130. By way of example, the measured color point produced by one of the windows 130 with the test light source is illustrated by point 234 and the shift $\Delta$nu'v' from the color point produced by the test light source without the window 130 (e.g., point 210) is illustrated by line 236. If desired, different formulations of the wavelength converting materials on a wavelength converting component may also be used, which would alter the color point produced by the wavelength converting materials (as illustrated by arrow 240), and thus, the slope of the color point shift.

Typically, there is a difference in spectral power distribution from one LED to the next. For example, LEDs that are supposed to produce blue light at 452 nm will typically produce light that may range between 450 nm and 455 nm or more. In another example, LEDs that are supposed to produce blue light may produce light that ranges between 440 nm and 475 nm. In this example, the spectral power distribution from one LED to another may be as much as 8%. Accordingly, during the assembly process, the spectral power distribution and/or color point of the LEDs 114 in the base 110 may be measured for each LED module 100 (310 in FIG. 6). The variation in the spectral power distribution of LEDs is one of the reasons why producing LED based light sources with consistent and accurate color points is difficult. However, because the LED module 100 includes two or more wavelength converting components with wavelength converting characteristics that can be individually selected, appropriate wavelength converting characteristics of the components can be selected for a large variation of spectral power distributions of LEDs 114 to produce a color point that is within a predetermined tolerance, e.g., a $\Delta$u'v' of less than 0.0035, from a target color point. The target color point may be, e.g., a CCT of 2700K, 3000K, 4000K, or other temperature on the black-body curve, or alternatively, the target color point may be off of the black-body curve.

Figure 7:
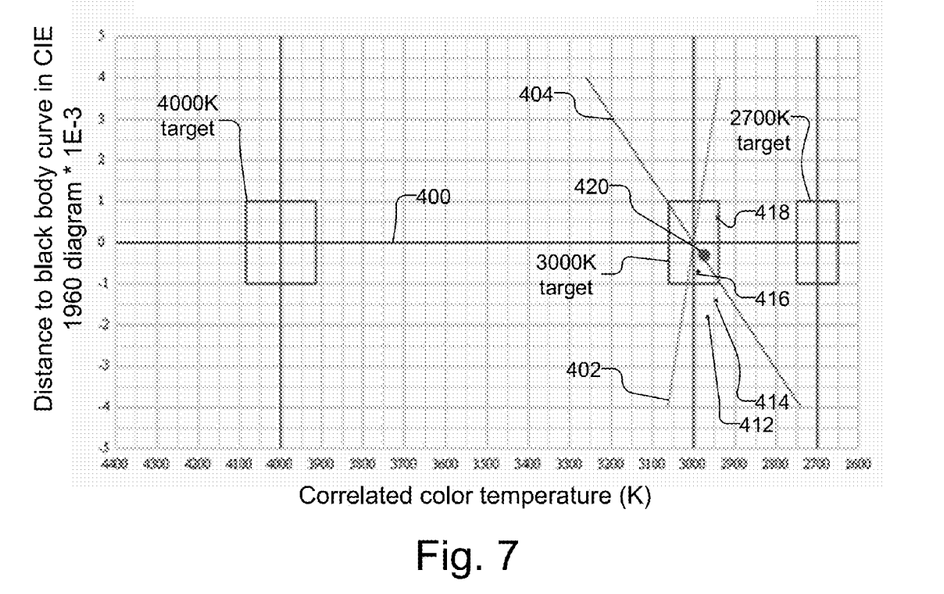
FIG. 7 is a diagram illustrating color points of LED modules and predetermined targets on the black-body curve from the CIE 1960 diagram where the X axis represents CCT and the Y axis represents the degree of departure ($\Delta uv$) from the black-body curve.

FIG. 7 is a diagram illustrating color points of LED modules and predetermined target color points on the black-body curve from the CIE 1960 UCS diagram where the X axis represents CCT and the Y axis represents the degree of departure (Δuv) from the black-body curve 400. The target color points may be, e.g., 4000K, 3000K and 2700K on the black-body curve 400. Other target CCTs or color points off of the black-body curve 400 may be used if desired. FIG. 7 illustrates a predetermined tolerance for each of the target color points with a rectangle. For example, at the target color point at 4000K the CCT may vary by ±90K, while at 3000K the CCT may vary by ±55K, and at 2700K the CCT may vary by ±50K. These predefined tolerances for CCT are within a two step MacAdam ellipse centered on each respective target color point on the black-body curve. The predetermined tolerance for the departure from the black-body curve Δuv for each CCT is ±0.001. In this example, Δuv may vary by a distance of 0.001 above the black-body curve 400 (expressed as a positive tolerance value, +0.001) and may vary by a distance of 0.001 below the black-body curve 400 (expressed as a negative tolerance value, −0.001). This predetermined tolerance for Δuv is within a one step MacAdam ellipse centered on each respective target color point on the black-body curve. The predetermined tolerances for CCT and Δuv illustrated in FIG. 7 is within a 2-step MacAdam ellipse and also within the tolerance of Δu'v' of 0.0035 shown in FIG. 5. The color points within the illustrated tolerance from the target color points are so close that the color difference is indistinguishable for most people even when the light sources are viewed side by side.

The diagram illustrates two color lines centered on the 3000K CCT for reference purposes. One color line 402 corresponds to the color point shift produced by a first wavelength converting material. In the present example, color line 402 is a yellow phosphor coating on the window 130. Color line 404 corresponds to the color point shift produced by a second wavelength converting material. In the present example, color line 404 is a red phosphor coating on the sidewall insert 126. Color line 402 indicates the direction of a shift in color point of light produced by the yellow phosphor. Color line 404 indicates the direction of shift in color point produced by the red phosphor. The first wavelength converting material and the second wavelength converting material are selected such that their respective directions of shift in color point are not parallel. Because the direction of shift of the yellow phosphor and the red phosphor are not parallel, the direction of the color point shift of light emitted by LED module 100 can be arbitrarily designated. This may be achieved by selecting the proper thickness and/or concentration of each phosphor as discussed above. By way of example, the small spots, 412, 414, 416, and 418 graphically illustrate the color points produced by one LED module 100 using different wavelength converting components. For example, spot 412 illustrates the color point for the LED module 100 with one set of wavelength converting components. By selecting a different window 130, the color point shifted for the LED module 100 to spot 414. As can be seen, the difference in the color points from spot 412 to 414 is parallel with the color line 402. A different sidewall insert 126 is then selected to produce a color point illustrated by spot 416. The difference in the color points from spot 414 to 416 is parallel with the color line 404. While this is within the 3000K target, an attempt to improve the color point by replacing the window 130 resulted in a color point illustrated by spot 418, where the shift between spot 416 and 418 is parallel with the color line 402. By again replacing the window 130 a color point of the LED module 100 shifted along line 402 to produce a color point illustrated by large spot 420, which is well within the predetermined tolerance from the target color point of 3000K on the black-body curve.

The above example illustrates a trial and error approach to selecting the appropriate wavelength converting components for a particular set of LEDs 114 to produce an LED module 100 with a desired color point. With a trial and error approach, it is unnecessary to measure the spectral power distribution of the light produced by the LEDs 114 before selecting the wavelength converting components. For example, a set of wavelength converting components may be selected and combined with the LEDs 114 and the resulting color point measured. Adjustments of the wavelength converting components may then be made based on the measured color point. However, in large scale production, it would be desirable to eliminate the trial and error approach. To eliminate the trial and error approach, the spectral power distribution and/or color point of the LEDs 114 would be measured and the wavelength converting components may then be appropriately selected to produce the target color point within a predetermined tolerance. The selection may be made based on, e.g., a database generated from previous trials or based on mathematical calculations. It may be desirable to measure the light output after the LEDs 114 are combined with the selected wavelength converting components to ensure the light is within the predetermined tolerance of the target color point, where one or both wavelength converting components may be changed if the light output is out of tolerance. For this purpose it is beneficial to label each module with a unique serial number, for example in the form of a barcode which can easily be scanned in the production process. It is beneficial to store in the database the spectral power densities of the board, and the final assembly, together with the types of wavelength converting components used. This data is then used by an algorithm to suggest the wavelength components to be used to achieve the desired performance of the modules.

With the two or more wavelength converting components selected, the LED module 100 can then be assembled (314). As discussed above, the assembly may include permanently attaching the base 110 with the reflective plate 113, the top section 120 with sidewall insert 126 and the window 130, e.g., with bolts, screws, clamps, epoxy, silicon, or other appropriate attachment mechanisms. By repeating this process multiple times, a plurality of LED modules 100 may be produced with nearly identical color points, e.g., each LED module 100 may produce a color point that differs from another by a predetermined tolerance, e.g., a Δuv of less than 0.001.

Thus, the LED module 100 includes a means for converting the spectral power distribution of the light emitting diodes to produce light from the light mixing chamber 101 with a color point within a degree of departure Δu'v' of 0.009 or smaller from a target color point in a CIE 1976 u'v' diagram. The means for converting the spectral power distribution includes a first means for converting the light produced by the light emitting diodes to produce a color point shift of a first magnitude along a first direction in the CIE 1976 u'v' diagram and a second means for converting the light produced by the light emitting diodes to produce a color point shift of a second magnitude along a second direction in the CIE 1976 u'v' diagram as illustrated in FIG. 4. As illustrated in FIG. 4, the first direction and the second direction are not parallel. Further, the first means and the second means are selectable to control their magnitudes in response to the spectral power distribution of the at least one light emitting diode to produce the desired color point within an acceptable degree of departure. The first means and second means for converting the light produced by the light emitting diodes may be the two or more wavelength converting components having differing wavelength converting characteristics and may be, e.g., the reflective bottom surface 113, sidewall 128, or window 130 of the LED module. Alternatively, the first means and second means may be located at the same position, e.g., both wavelength converting components are on the window 130, sidewall 128 or bottom surface 113. The wavelength converting components may be covered with or infused with wavelength converting materials, such as phosphor or luminescent dyes. Further, the wavelength converting components are selectable from a plurality of similar wavelength converting components that differ in the coverage areas, concentration, and thickness of the wavelength converting materials to produce different magnitudes in the color point shift in the CIE 1976 u'v' diagram. The means for converting the spectral power distribution may also include a third or additional means for converting the light produced by the light emitting diodes that differs from the first means and the second means. The means for converting the spectral power distribution may incorporate the first means and the second means into a single selectable component, e.g., the window 130, sidewall 128 or bottom surface 113. The inventors have determined that when separate selectable components are used, e.g., a window 130 with a yellow phosphor and sidewall 128 with a red phosphor, approximately 10 different types of windows, i.e., 10 different wavelength converting characteristics, and 5 to 10 different types of sidewalls, i.e., 10 different wavelength converting characteristics, are generally adequate to produce the desired target color points with a small degree of departure, e.g., Δu'v' of 0.009 or less. Accordingly, if the first means and second means are to be located in one selectable component, approximately 40 to 100 different selectable components would have to be produced and kept in inventory. Further, by separating the first means and second means, higher efficiencies and color rendering indices are achievable. Alternatively, the first means and second means may be separate, but pre-assembled into one selectable component, e.g., a window may be pre-assembled with a sidewall or bottom surface. Again, 40 to 100 different pre-assembled components would have to be produced and kept in inventory to achieve the same possible variation as using 10 types of a first means and 5-10 types of a separately selectable second means.

Figure 8:
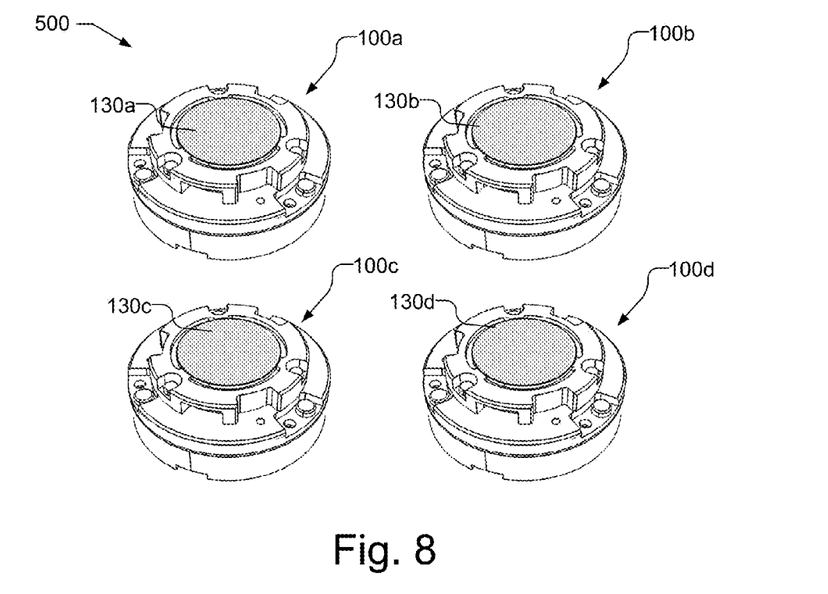
FIG. 8 illustrates a set of LED modules that all produce the same color point within a predetermined tolerance using wavelength converting components having differing wavelength converting characteristics.

FIG. 8 illustrates a set 500 of a plurality of LED modules 100a, 100b, 100c, and 100d (collectively referred to sometimes as LED modules 100) that all produce the same color point within a predetermined tolerance, which can be accomplished as described above. To produce the same color point, each of the LED modules 100 in the set 500 uses wavelength converting components with different wavelength converting characteristics based on the spectral power distribution of the LEDs 114 in the LED modules 100. By way of example, at least one of the windows 130a, 130b, 130c, and 130d, the sidewall inserts 126 (shown in FIG. 2) or the reflective plate (shown in FIG. 2), may have different wavelength converting characteristics as illustrated by the shading of windows 130a, 130b, 130c, and 130d. When installed, e.g., in a display, downlighting, or overhead lighting, the LED modules 100a, 100b, 100c, and 100d will produce light with color points that are difficult for a human observer to distinguish.

Figure 9:
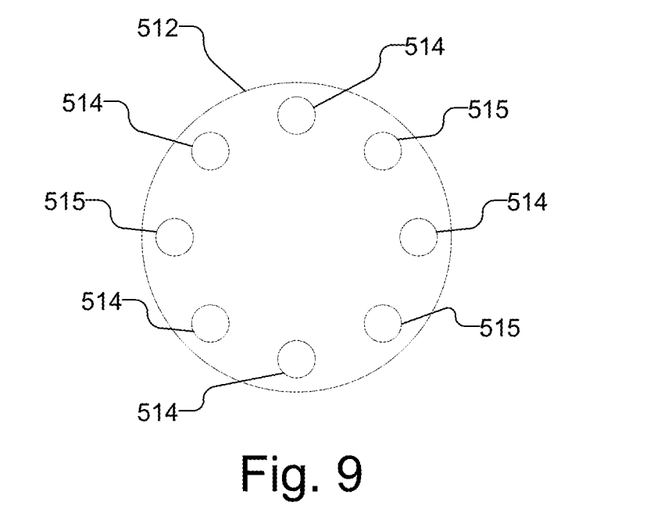
FIG. 9 illustrates a board with a plurality of packaged LEDs having differing wavelengths.

Additionally, if desired, different wavelength LEDs 114 may be used in an LED module to improve the color rendering index (CRI). When all the LEDs 114 in the LED module 100 have substantially the same peak wavelengths, e.g., all the LEDs 114 are from the same bin having a bin size of 5 nm (for example a bin that includes 450 nm to 455 nm), a CRI value between, e.g., 75-85 may be achieved for an LED module 100 with CCTs of 2700K, 3000K, and 4000K, when a yellow (YAG) phosphor is used on the window 130 and red phosphor with a peak wavelength of 630 nm is used on the sidewall insert 126. However, by replacing one or more of the LEDs 114 with LEDs from a different bin so that the peak wavelength differs from the peak wavelength of LEDs 114 by 10 nm or more, a higher CRI may be achieved. FIG. 9, by way of example, illustrates board 512 with a plurality of packaged LEDs 514 each having a peak wavelength of, e.g., 452 nm and a second plurality of LEDs 515, each having a peak wavelength that is more than 10 nm greater than the wavelength of LEDs 514. By way of example, the peak wavelength of the LEDs 515 may be between, e.g., 470 nm and 510 nm. As illustrated in FIG. 9, the LEDs 515 are symmetrically arranged on the board 512 if possible. The board 512 with LEDs 514 and 515 may be used in place of board 112 shown in FIG. 2. Compared to a board with LEDs that all have the same 452 nm peak wavelength, board 512 achieves a higher CRI value. By way of example, an LED module 100 having a CCT of 2700K, 3000K or 4000K, may use five LEDs 514 with a wavelength between 450 nm and 455 nm and three LEDs 515 with a wavelength of 500 nm to 510 nm to achieve a CRI of 95. The use of higher wavelength LEDs decreases efficiency, in terms of lumen out of the LED module divided by electrical power going in. Thus, the number of LEDs 515 with different wavelengths and the particular wavelength of the LEDs 515 that are used is a balance of the target CRI value and the desired efficiency for the LED module 100.

Additionally, phosphors may be used to produce high CRI values. A number of these phosphors are typically not used with LEDs due to the sensitivity of their respective emission properties to heat. However, the phosphors on the wavelength converting components, particularly the window 130 and the sidewall insert 126, are physically distant from the heat producing LEDs 114. In addition, the top section 120 of the LED module 100 is thermally coupled to the wavelength converting components and acts as a heat sink. Thus, the phosphors can be maintained at a relatively low temperature. For example, phosphors deposited directly on an LED source may reach temperatures in excess of 150 degrees centigrade, whereas the phosphors deposited on window 130 and sidewall insert 126 typically reach temperatures of approximately 70 to 90 degrees centigrade. As a result of the use of thermally sensitive phosphors LED module 100 may be tailored to produce a desired CRI value. For example, phosphors such as $La_3Si_6N_{11}:Ce, LaSi_3N_5, (Sr,Ca)AlSiN_3:Eu, CaAlSiN_3:Eu^{2+}$, $(Sr,Ca)AlSiN_3:Eu^{2+}, Ca_3(Sc,Mg)_2Si_3O_{12}:Ce$, $Sr_{0.8}Ca_{0.2}AlSiN_3:Eu, CaSc_2O_4:Ce, (Sr,Ba)_2SiO_4:Eu^{2+}$, $SrGa_2S_4:Eu^{2+}, SrSi_2N_2O_2:Eu^{2+}, Ca_3Sc_2Si_3O_{12}:Ce^{3+}$, $Y_{3-x}Al_2Al_3O_{12}:Ce^{x+}$ and $Lu_{3-x}Al_2Al_3A_{12}:Ce^{x+}$, can be used on wavelength converting components to produce CRI values of 80 and higher, or even 95 and higher.

Although the present invention is illustrated in connection with specific embodiments for instructional purposes, the present invention is not limited thereto. It should be understood that the embodiments described herein may use any desired wavelength converting materials, including dyes, and are not limited to the use of phosphors. Various adaptations and modifications may be made without departing from the scope of the invention. Therefore, the spirit and scope of the appended claims should not be limited to the foregoing description.

What is claimed is:

1. An illumination module comprising:
    at least one light emitting diode operable to produce an amount of light with a spectral power distribution; and
    a light mixing chamber configured to convert a portion of the amount of light emitted by the at least one light emitting diode to an amount of converted light output from an output port of the light mixing chamber, wherein the light mixing chamber includes a first type of wavelength converting material having a first wavelength converting characteristic, and a second type of wavelength converting material having a second wavelength converting characteristic that is different from the first wavelength converting characteristic, the first type of wavelength converting material and the second type of wavelength converting material being located on a component of the light mixing chamber that is physically separated from the at least one light emitting diode such that the first type of wavelength converting material and the second type of wavelength converting material are each in a direct optical path of the light emitted by the at least one light emitting diode;

wherein an amount of the first type of wavelength converting material and an amount of the second type of wavelength converting material are selected such that the light that is output from the output port has a color point within a degree of departure Δu'v' of 0.009 from a target color point in a CIE 1976 u'v' diagram.

2. The illumination module of claim 1, wherein the first type of wavelength converting material produces a color point shift along a first direction in a CIE 1976 u'v' diagram in response to the amount of light produced by the at least one light emitting diode and the second type of wavelength converting material produces a color point shift along a second direction in the CIE 1976 u'v' diagram in response to the amount of light produced by the at least one light emitting diode, wherein the first direction and the second direction are not parallel.

3. The illumination module of claim 1, wherein the target color point is the color point of one of illuminant series D and a black-body radiator with a temperature of one of 2700K, 3000K, 3500K, 4000K, 4200K, 5000K, 6500K.

4. The illumination module of claim 1, wherein an amount of the first type of wavelength converting material and an amount of the second type of wavelength converting material are selected based on a measured spectral power distribution of the at least one light emitting diode.

5. The illumination module of claim 1, wherein the light mixing chamber is formed in a housing and the wavelength converting component is mounted to the housing.

6. The illumination module of claim 1, wherein the light that is output from the output port has a color point within a degree of departure Δu'v' of 0.0035 from a target color point in the CIE 1976 u'v' diagram.

7. The illumination module of claim 5, wherein the wavelength converting component is an output window.

8. An illumination module comprising:
at least one light emitting diode operable to produce an amount of light with a spectral power distribution; and
a light mixing chamber configured to convert a portion of the amount of light emitted by the at least one light emitting diode to an amount of converted light output from an output port of the light mixing chamber, wherein the light mixing chamber includes a first type of wavelength converting material having a first wavelength converting characteristic, and a second type of wavelength converting material having a second wavelength converting characteristic that is different from the first wavelength converting characteristic, the first type of wavelength converting material and the second type of wavelength converting material being located on a wavelength converting component that is physically separated from the at least one light emitting diode such that the first type of wavelength converting material and the second type of wavelength converting material are each in a direct optical path of the light emitted by the at least one light emitting diode;

wherein an amount of the first type of wavelength converting material and an amount of the second type of wavelength converting material are selected such that the light that is output from the output port has a color point within a degree of departure Δu'v' of 0.009 from a target color point in a CIE 1976 u'v' diagram.

9. The illumination module of claim 8, wherein the first type of wavelength converting material produces a color point shift along a first direction in a CIE 1976 u'v' diagram in response to the amount of light produced by the at least one light emitting diode and the second type of wavelength converting material produces a color point shift along a second direction in the CIE 1976 u'v' diagram in response to the amount of light produced by the at least one light emitting diode, wherein the first direction and the second direction are not parallel.

10. The illumination module of claim 8, wherein the target color point is the color point of one of illuminant series D and a black-body radiator with a temperature of one of 2700K, 3000K, 3500K, 4000K, 4200K, 5000K, 6500K.

11. The illumination module of claim 8, wherein an amount of the first type of wavelength converting material and an amount of the second type of wavelength converting material are selected based on a measured spectral power distribution of the at least one light emitting diode.

12. The illumination module of claim 8, wherein the light mixing chamber is formed in a housing and the wavelength converting component is mounted to the housing.

13. The illumination module of claim 8, wherein the light that is output from the output port has a color point within a degree of departure Δu'v' of 0.0035 from a target color point in the CIE 1976 u'v' diagram.

14. The illumination module of claim 12, wherein the wavelength converting component is an output window.

15. An illumination module comprising:
at least one light emitting diode operable to produce an amount of light with a spectral power distribution; and
a light mixing chamber configured to convert a portion of the amount of light emitted by the at least one light emitting diode to an amount of converted light, wherein the light mixing chamber comprises:
an output port operable to output a portion of the amount of converted light;
a first wavelength converting material for converting a first portion of the light with the spectral power distribution of the at least one light emitting diode to produce light with second spectral power distribution; and
a second wavelength converting material for converting a second portion of the light with the spectral power distribution of the at least one light emitting diode to produce light with a third spectral power distribution, the first type wavelength converting material and the second type of wavelength converting material being physically separated from the at least one light emitting diode are each in a direct optical path of the light emitted by the at least one light emitting diode, wherein an amount of the second wavelength converting material is configured to be adjusted to adjust the light with the third spectral power distribution to produce combined light emitted from the output port from the light mixing chamber with a color point within a degree of departure Δu'v' of 0.009 from a target color point in a CIE 1976 u'v' diagram.

16. The illumination module of claim 15, wherein:
the first wavelength converting material converts the light produced by the at least one light emitting diode to produce a color point shift of a first magnitude along a first direction in a CIE 1976 u'v' diagram; and the second wavelength converting material converts the light produced by the at least one light emitting diode to produce a color point shift of a second magnitude along a second direction in the CIE 1976 u'v' diagram, wherein the first direction and the second direction are not parallel, and wherein the first wavelength converting material and the second wavelength converting material are selectable to control the first magnitude and the second magnitude in response to the spectral power distribution of the at least one light emitting diode.

17. The illumination module of claim 16, wherein at least one of the first wavelength converting material and the second wavelength converting material is an output window.

18. The illumination module of claim 16, wherein a light mixing chamber is formed in a housing and at least one of the first wavelength converting material and the second wavelength converting material is mounted to the housing.

19. The illumination module of claim 16, wherein the light that is output from the output port has a color point within a degree of departure $\Delta u'v'$ of 0.0035 from a target color point in the CIE 1976 u'v' diagram.

* * * * *